United States Patent [19]

Nagy et al.

[11] Patent Number: 5,322,975
[45] Date of Patent: Jun. 21, 1994

[54] UNIVERSAL CARRIER SUPPORTED THIN COPPER LINE

[75] Inventors: Albert E. Nagy, Mentor-on-the Lake; Thomas J. Ameen, Mentor; Peter Peckham, Concord, all of Ohio

[73] Assignee: Gould Electronics Inc., Eastlake, Ohio

[21] Appl. No.: 947,711

[22] Filed: Sep. 18, 1992

[51] Int. Cl.$^5$ .............................................. H05K 1/00
[52] U.S. Cl. .................................. 174/257; 156/289; 428/650; 428/674
[58] Field of Search ................ 174/257; 428/658, 650, 428/641, 631, 901, 674; 156/150, 233, 289, 300, 325; 427/406

[56] References Cited

U.S. PATENT DOCUMENTS

| | | | |
|---|---|---|---|
| 3,969,199 | 7/1976 | Berdan et al. | 204/33 |
| 3,998,601 | 12/1976 | Yates et al. | 29/195 |
| 4,049,481 | 9/1977 | Morisaki | 156/151 |
| 4,088,544 | 5/1978 | Hutkin | 204/12 |
| 4,431,710 | 2/1984 | Lifshin et al. | 428/650 |
| 4,452,664 | 6/1984 | Grey, Jr. et al. | 156/631 |
| 4,455,181 | 6/1984 | Lifshin et al. | 156/150 |

*Primary Examiner*—Leo P. Picard
*Assistant Examiner*—Cheryl R. Figlin
*Attorney, Agent, or Firm*—Michael A. Centanni

[57] ABSTRACT

An easily peelable or chemically strippable laminate and method of making same comprising an aluminum carrier, an aluminum oxide layer, which is at least 800 Angstroms thick and deposited on the aluminum carrier, copper foil electrodeposited on the aluminum oxide layer and optionally, a brass layer electrodeposited on the copper foil have been discovered. Such laminates find utility in the electronics industry in the fabrication of printed circuit boards and afford an ease of strippability of the protective aluminum carrier-aluminum oxide layer heretofore unknown in the industry. The protective aluminum carrier-aluminum oxide layer of the laminates of the present invention may also be chemically etched away providing a universal carrier for copper foil.

24 Claims, 1 Drawing Sheet

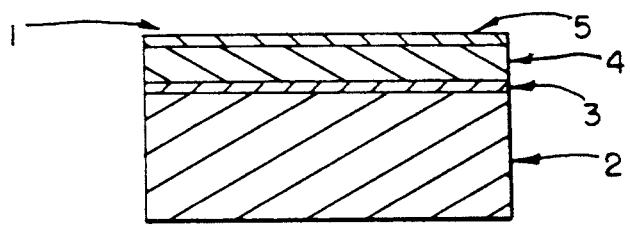
FIG. 1
PRODUCTION BT LAM CYCLE
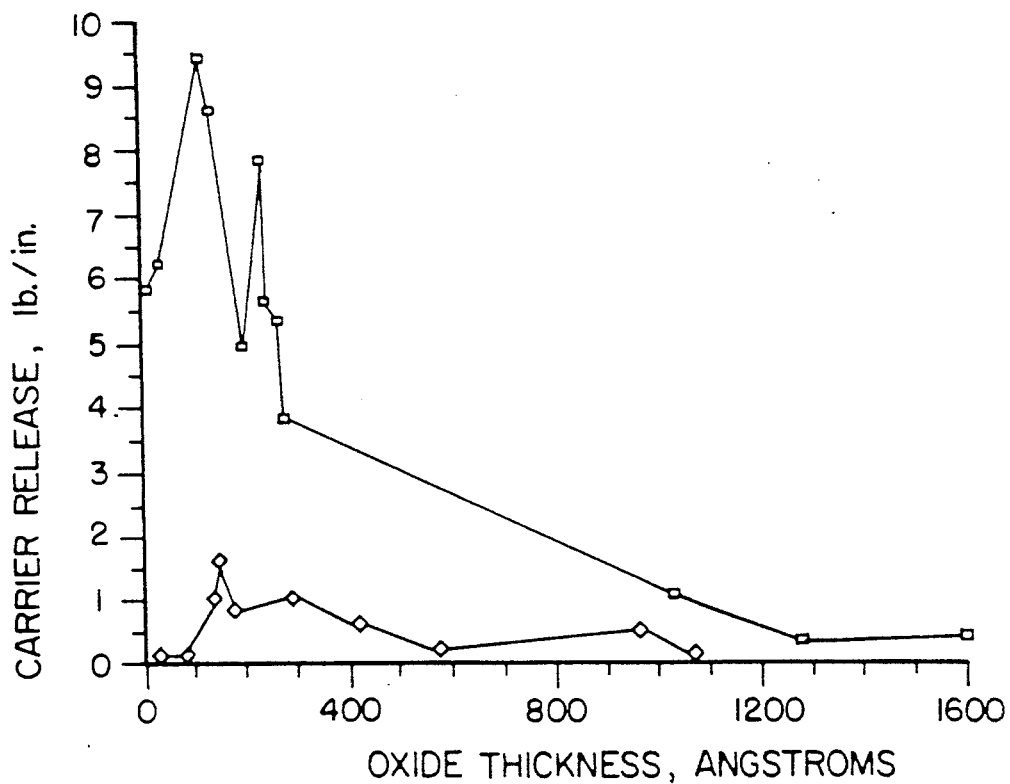
FIG. 2  □ BRASS BARRIER
◇ ZN BARRIER

UNIVERSAL CARRIER SUPPORTED THIN COPPER LINE

BACKGROUND OF THE INVENTION

1. Field of the Invention

The present invention relates generally to metallic laminates and more particularly to metallic laminates suitable for use in the electronics industry. Specifically, the present invention relates to an aluminum carrier-aluminum oxide layer with a layer of copper electrodeposited on the aluminum oxide layer and a barrier layer of brass electrodeposited on top of the layer of copper.

2. State of the Art

Copper foil finds utility in the production of printed circuit boards. It is desirable to protect the copper foil from the point of electroforming the copper foil to the point of laminating the copper foil to a polymeric substrate, as is typically done in the industry.

One method of protecting the copper foil involves electrodepositing the copper foil on top of an aluminum substrate. This aluminum substrate, or carrier as it is frequently termed, protects one side of the copper foil, typically termed the shiny side of the copper foil. The other side of the copper foil, i.e., the matte side, is adhered under elevated temperatures and pressures to a polymeric substrate. Subsequent to this procedure, the aluminum layer may be mechanically stripped away leaving an exposed pristine surface of copper. This surface of copper is masked and etched resulting in the desired circuitry in the form of a network of copper lines.

The aluminum carrier layer may be removed by chemical means as opposed to the aforementioned mechanical means. In this approach, the aluminum layer is chemically etched from the surface of the copper layer.

As aluminum readily oxidizes, the copper foil is actually electrodeposited on a layer of aluminum oxide. Difficulties may arise in employing aluminum as a carrier. For instance, copper atoms may diffuse into the aluminum carrier producing a laminate that is difficult to process, i.e., the interdiffusion of copper atoms into the aluminum layer results in a laminate which is not easily peelable. In the past, one technique utilized to overcome this problem has been to electrodeposit a thin layer of zinc on the matte side of the copper surface. This zinc layer minimizes the diffusion of copper atoms into the aluminum carrier layer. However, the use of a thin layer of zinc on the matte side of the copper foil does not alleviate the problem of the undercutting of the copper foil from the underlying polymeric substrate during etching. A thin layer of brass has not been utilized in the past because brass does not suppress the diffusion of copper atoms into the aluminum layer and, inter alia, creates release problems of the copper from the aluminum carrier.

The following U.S. patents describe inventions relating to copper foil laminates.

Lifshin et al., U.S. Pat. No. 4,431,710, describe a copper-clad laminate in which an initial copper film is formed on an aluminum carrier by vapor deposition at a temperature of between 100 degrees Celsius and 250 degrees Celsius.

Berdan et al., U.S. Pat. No. 3,969,199, describe an improved mechanically strippable copper plate on an aluminum carrier wherein the aluminum carrier is pretreated with an alkaline, aqueous, alkali metal zincate composition containing a small amount of one or more soluble cobalt or nickel salts and removing the zincate coating with acid prior to plating with copper.

Morisaki, U.S. Pat. No. 4,049,481, describes a method of electrodepositing a binary alloy consisting of zinc and tin on copper foil as a barrier layer to the migration of copper during heat press lamination onto an adhesive substrate.

Hutkin, U.S. Pat. No. 4,088,544, describes a method and a composite which relate to enhanced strippability of an aluminum carrier from the underlying copper foil and to improved adhesion between the copper foil and the underlying polymeric substrate.

Yates et al., U.S. Pat. No. 3,998,601, describe a copper foil laminate and a method of making a copper foil laminate wherein the laminate contains a release layer.

Grey, Jr. et al., U.S. Pat. No. 4,452,664, describe a method of making a copper-clad laminate wherein a copper film is vapor deposited on the matte side of an aluminum carrier.

SUMMARY OF THE INVENTION

In accordance with the present invention, it has been discovered that an aluminum carrier-aluminum oxide layer which is at least 800 Angstroms thick and deposited on the aluminum carrier greatly reduces the diffusion of copper atoms into the aluminum carrier resulting in an aluminum carrier that is easily peeled or chemically stripped from the underlying copper foil. Additionally, the use of a brass barrier layer affords excellent bonding between the copper foil and the underlying polymeric substrate resulting in a copper foil that may be etched without the undercutting and delamination typically observed with the use of zinc as a barrier layer.

The laminate disclosed by the present invention is comprised of an aluminum carrier, a layer of aluminum oxide, a thin layer of copper foil electrodeposited on the aluminum oxide and a thin layer of brass electrodeposited on the copper foil. The side of the copper foil that has the layer of brass electrodeposited thereon may then be affixed to a polymeric substrate. Subsequently, the aluminum carrier layer and the aluminum oxide layer may be either mechanically or chemically removed and the copper layer masked and chemically etched to produce an electrically conductive patterned circuit of copper foil.

Further, in accordance with the present invention, a process resulting in a aluminum-aluminum oxide-copper-brass laminate which overcomes some major disadvantages of copper-aluminum laminates currently used in the production of printed circuit boards has been discovered. In particular, the laminates disclosed in the present invention, provide aluminum-aluminum oxide-copper layers having improved release properties. The method of making and the composition of the metallic laminate of the present invention result in minimal loss in peel strength between the copper foil and the underlying polymeric substrate. As a result of the electrodeposited brass layer, the laminate disclosed in the present invention shows little loss of adhesion at the copper foil-brass-polymer interface. The loss of adhesion which is overcome by the present invention is typically encountered in circuit line etching.

It has been observed that the aluminum oxide layer produced by the present invention provides a copper deposit which exhibits a low porosity. Additionally, the brass layer interposed between the layer of copper foil and the polymeric substrate provides a thermal barrier which minimizes peel strength degradation after exposure to elevated temperatures for extended times.

The aluminum oxide layer acts as a release agent for the aluminum carrier. The mechanical release strength is a function of the thickness of this release layer and may be controlled during the first step related herein, i.e., the anodization of the aluminum carrier.

These and other aspects of the present invention will become clear to those skilled in the art upon the reading and understanding of the specification and claims.

BRIEF DESCRIPTION OF THE DRAWINGS

The invention will be further described in connection with the attached drawing figures illustrating preferred embodiments of the invention including elements and arrangements of elements. It is intended that the drawings included as part of this specification be illustrative of the preferred embodiments of the present invention and should in no way be considered a limitation on the scope of the invention.

FIG. 1 is a cross-section of a laminate according to the present invention showing the various layers of the laminate in accordance with the present invention.

FIG. 2 is a plot of the release strength in pounds per inch of the aluminum carrier as it is peeled from the rest of the laminate as a function of aluminum oxide thickness in Angstroms.

DETAILED DESCRIPTION OF THE PREFERRED EMBODIMENTS

Referring to FIG. 1, an easily peelable and etchable aluminum-aluminum oxide-copper foil-brass laminate 1 has been discovered. This laminate 1 may be made by a continuous process, whereby an aluminum carrier foil 2 of a thickness of from about 1.5 to about 3 mils is advanced through an anodizing bath resulting in the formation on one side of the aluminum of a layer of aluminum oxide 3 which may have a varying thickness depending upon the desired release strength of the copper foil from the carrier. The aluminum-aluminum oxide carrier foil is subsequently advanced through an electrodeposition bath wherein a layer of copper 4 of desired thickness is electrodeposited on top of the aluminum oxide layer 3, and finally the aluminum-aluminum oxide-copper laminate is advanced through an electrodeposition bath wherein a layer of brass 5 is electrodeposited on top of the layer of copper 4. The side of the metallic laminate, containing brass wherein the brass has been electrodeposited on the matte side of the copper foil, is subsequently adhered to a polymeric substrate such that the matte side of the copper, with the surface layer of brass thereon, is affixed to the polymeric substrate. The aluminum carrier and aluminum oxide layer are easily mechanically peeled or chemically stripped away. The exposed copper surface is masked and etched resulting in a circuit board for use in the electronics industry.

The anodization of the aluminum carrier to the extent of producing an aluminum oxide layer which is at least about 800 Angstroms thick, preferably at least about 900 Angstroms thick, more preferably at least about 1000 Angstroms thick and most preferably at least about 1100 Angstroms thick coupled with the electrodeposition of a brass barrier layer on the matte side of the copper foil results in an aluminum-aluminum oxide-copper-brass laminate with the previously stated desirable properties. Although the brass layer is not necessary to the practice of the present invention, the brass layer minimizes peel strength degradation between the copper foil and the polymeric substrate after exposure of the printed circuit board to elevated temperatures for extended times. Peel strength losses as measured between the copper foil and the underlying polymeric substrate of ten percent (10%) or less are realized, where the peel strengths are determined after the composite is exposed to a temperature of about 180 degrees Celsius for about 48 hours.

The mechanical release strengths between the aluminum carrier-aluminum oxide layer and the copper layer are a function of the thicknesses of the aluminum oxide layer. The thickness of the aluminum oxide layer may be controlled through the application of various voltages or by varying the residence time of the aluminum carrier in the anodizing bath resulting in release strengths for both mechanically removable aluminum carriers-aluminum oxide layers and chemically etchable aluminum carriers-aluminum oxide layers of from about 0.1 lb./in. to about 10 lbs./in., preferably from about 0.1 lb./in. to about 6.2 lb /in., more preferably from about 0.1 lb./in. to about 1.7 lb./in. and most preferably from about 0.1 to about 0.5 lb./in. (see FIG. 2).

The aluminum oxide layer produced by the present invention provides a copper layer which exhibits a low porosity. The porosity of the copper layer of the present invention is less than about 10 pores/sq.ft., preferably less than about 6 pores/sq.ft., more preferably less than about 4 pores/sq.ft. and most preferably less than about 3 pores/sq.ft. Porosities of up to about 200 pores/sq.cm. (185,806 pores/sq.ft.) have been observed in the industry.

The laminates of the present invention have the advantage of minimizing the undercutting of the copper foil from the polymeric substrate during circuit line etching. Undercutting with a zinc barrier layer is from about 50% to about 100%. With a brass barrier layer and in accordance to the present invention, the undercutting is less than about 20% and preferably from about 2% to about 10%.

The laminates of the present invention are produced by the following process. Aluminum foil of thickness equal to about 1.3 mils to about 3.3 mils, preferably about 1.4 mils to about 3.2 mils and most preferably from about 1.5 mils to about 3 mils to is introduced into a bath wherein the surface of the aluminum foil is cleaned. This cleaning may be effected in a number of ways and the preferred method is to use a chemical reagent. For example, the aluminum carrier layer is first treated with an alkali solution to remove oil and various surface contaminants therefrom. A typical alkali etchant utilized in the practice of the subject invention includes 20 g/l sodium hydroxide, 25 g/l sodium gluconate and 0.1 ml/l tergitol. The duration of exposure to the etchant is a function of the surface contamination of the aluminum carrier layer and is determined empirically.

The so-treated aluminum foil is then, if desired, water rinsed and subsequently positioned in a suitable electrolyte and electric current is directed therethrough in such a manner as to render the foil cathodic to activate the surface thereof. The water rinsing is not required, but improved results are realized when it is employed. The exact electrolytic composition utilized may be varied and many such compositions are known to those skilled in the art. However, one electrolytic composition which has been found to be exceptionally useful for this purpose includes, in percent by volume, from about 53 to 73% phosphoric acid, from 5 to 25% sulfuric acid and from 12 to 32% water. Typically, the voltage across the foil ranges from about 3 to 15 volts and the current density ranges from about 20 to 100 amps/sq. ft.

Once the aluminum foil has been rendered cathodic to activate the surface thereof, if desired, the so-treated foil is then water rinsed at room temperature. In this regard, any form of non-contaminated water may be employed to accomplish rinsing during the practice of the invention.

The foil is then positioned in an electrolytic bath and electric current passed therethrough in such a manner that the aluminum foil is rendered anodic to from a layer of aluminum oxide of about 1100 Angstroms thick on the surface thereof. Suitable electrolytes which are known in the art, may be used for this purpose. However, one electrolytic bath which has been found to be especially well suited for this purpose includes, in percent by volume, from about 53 to 73% phosphoric acid, from 5 to 25% sulfuric acid, and from 12 to 32% water. The voltages that may be applied across the aluminum foil are relatively low and range on the order of from about 1 to 15 volts. The current densities resulting from the applied voltages range from about 5 to 30 amps/sq. ft. By following this technique, a surface layer of aluminum oxide is formed on the foil which serves as a suitable surface for accepting electrolytically deposited copper.

If desired, the so-treated aluminum foil is water rinsed and copper is then electrolytically deposited on the surface of the anodically treated aluminum carrier layer by conventional techniques. The electrodeposited copper foil may have a thickness of about 3 microns to about 12 microns, preferably about 4 to about 10 microns and most preferably about 5 or about 9 microns. Typical of a bath suitable for this purpose is a standard pyrophosphate bath which typically contains 22.5 g/l of copper, 160 g/l of pyrophosphate and has a pH of about 8.3. Electrodeposition of the copper is accomplished by operating the bath at a temperature of about 135 degrees Fahrenheit, at a voltage of about 3 volts and a current density of about 30 amps/sq. ft.

In the manufacture of a composite structure intended for use in the fabrication of printed circuits, it is common to electrodeposit a layer of copper having a thickness ranging from about 1 to about 17 microns on the aluminum carrier-aluminum oxide material. However, when it is desired to produce a foil which may be used to form a printed circuit while minimizing undercutting problems, it is common practice to form the copper layer in such a manner that it has a resultant thickness ranging from about 5 to about 10 microns.

The present invention may be accomplished in either a batch or a continuous manner. That is, aluminum foil may be continuously fed from a roll into a chemical cleaning solution, from the chemical cleaning solution into an optional but preferred water rinse, from the water rinse into an electrolytic solution for cathodic activation, from the electrolytic solution into an optional but preferred water rinse, from the water rinse into an electrolytic solution to anodically treat the surface of the aluminum foil, from the anodic treatment bath into an optional but preferred water rinse, and then directly into a copper electroplating bath. Or, if desired, each one of the before described sequential steps may be accomplished individually.

After the aluminum-aluminum oxide-copper laminate is formed, the laminate is advanced to a nodulation treatment bath. With no intention to be limited by the following nodulation treatment and chemistry, as other treatments and chemistries are contemplated, the following nodulation bath may be employed. The nodulation treatment is perfected by applying between 200 and 400 amps/sq. ft., preferably between 250 and 350 amps/sq.ft., for 5 to 10 seconds, preferably 6 to 7 seconds, in a bath having a temperature of about 100 degrees Fahrenheit and comprising the following chemistry:

| NODULATION BATH CHEMISTRY | |
|---|---|
| BATH COMPONENTS | AMOUNT |
| copper cyanide | 49.3 g/l |
| sulfuric acid | 100 g/l |
| nitrate as nitric acid | 4 g/l |
| chlorides | 15 ppm. |

As known in the art, the chlorides may be added, for example, as copper chloride or other soluble salts. This particular nodulation treatment enhances the adhesion of the copper foil to the underlying thermoplastic by a factor of from about 2 to about 4 times that obtained without the nodulation treatment.

To improve the thermal properties of the aforementioned laminate, i.e., to stabilize the copper-polymer substrate peel strengths subsequent to thermal exposures, the aluminum-aluminum oxide-copper laminate is advanced, after the nodulation treatment, to a brass electroplating cell. Brass of thickness equal to about 500 Angstroms to about 2000 Angstroms, preferably about 750 Angstroms to about 1750 Angstroms, more preferably about 850 Angstroms to about 1700 Angstroms and most preferably about 900 Angstroms to about 1600 Angstroms is electroplated on top of the nodulation layer by applying from about 20 to about 80 amps/sq.ft., preferably from about 30 to about 70 amps/sq.ft., and most preferably from about 40 to about 60 amps/sq.ft. to the anodes for about 5 to about 10 seconds, preferably about 6 to about 7 seconds, as the laminate is advanced through a brass electrodeposition bath, the bath having a temperature of about 130 to 150 degrees Fahrenheit, and comprising the following chemistry:

| BATH COMPONENTS | AMOUNT |
|---|---|
| copper cyanide | 24.7 g/l |
| zinc cyanide | 4.8 g/l |
| sodium cyanide | 13.5 g/l |
| sodium hydroxide | 25 g/l | or more preferably, the following chemistry:

| BATH COMPONENTS | AMOUNT |
|---|---|
| copper sulfate pentahydrate | 70 g/l |
| zinc cyanide | 2.7 g/l |
| sodium cyanide | 15 g/l |
| sodium hydroxide | 10 g/l. |

An etchable and peelable product may be made with or without the brass layer, and with or without the aforementioned nodulation treatment.

The present invention has been described with reference to preferred embodiments. Other modifications and alterations will occur to those skilled in the art upon reading and understanding the specification. It is intended that all modifications and alterations be included insofar as they come within the scope of the appended claims or equivalents thereof.

We claim:

1. A laminate, comprising:
   a) an aluminum carrier;
   b) a layer of aluminum oxide of at least about 800 Angstroms thick on said aluminum carrier; and
   c) a layer of copper electrodeposited on said layer of aluminum oxide.

2. The laminate of claim 1 wherein a thin layer of brass is electrodeposited on said layer of copper.

3. The laminate of claim 2 wherein said layer of aluminum oxide is about 1100 Angstroms thick.

4. The laminate of claim 2 or 3 wherein said brass layer is about 1000 Angstroms thick.

5. The laminate of claim 4 wherein said copper layer is about 5 microns thick.

6. The laminate of claim 4 wherein the copper layer is about 9 microns thick.

7. A method of making a laminate, comprising:
   a) producing an aluminum oxide layer of a thickness of at least about 800 Angstroms on an aluminum carrier; and
   b) electrodepositing a layer of copper on said aluminum oxide.

8. The method of claim 7 wherein a thin layer of brass is electrodeposited on said layer of copper.

9. The method of claim 8 wherein said aluminum oxide layer is about 1100 Angstroms thick.

10. The method of claim 8 or 9 wherein said layer of brass is about 1000 Angstroms thick.

11. The method of claim 10 wherein said layer of copper is about 5 microns thick.

12. The method of claim 10 wherein said layer of copper is about 9 microns thick.

13. A printed circuit board, comprising:
   a) a polymer substrate; and
   b) an etched copper foil comprising a patterned circuit; wherein said printed circuit board is produced by the process comprising:
   adhering said copper foil to said polymer substrate wherein said copper foil is removably adhered to a metal foil laminate, comprising:
   i) an aluminum carrier,
   ii) a layer of $Al_2O_3$ at least about 800 Angstroms thick on said aluminum carrier, and,
   iii) a layer of copper which has been electrodeposited on said layer of aluminum oxide,
   wherein:
   (1) said layer of copper has been adhered to said polymer substrate; and
   (2) said aluminum and aluminum oxide are either mechanically or chemically removed from said layer of copper; and,
   (3) said layer of copper is chemically etched to form a patterned circuit.

14. The printed circuit board of claim 13 wherein a thin layer of brass is electrodeposited on said layer of copper prior to bonding said brass layer to said polymer substrate.

15. The printed circuit board of claim 13 or 14 wherein said copper layer is about 5 microns thick.

16. The printed circuit board of claim 13 or 14 wherein said copper layer is about 9 microns thick.

17. The laminate of claim 2 wherein said aluminum oxide has a release strength of from about 0.1 lb./in. to about 0.5 lb./in.

18. The laminate of claim 5 wherein said aluminum oxide has a release strength of from about 0.1 lb./in. to about 0.5 lb./in.

19. The laminate of claim 6 wherein said aluminum oxide has a release strength of from about 0.1 lb./in. to about 0.5 lb./in.

20. The laminate of claim 1 wherein said copper exhibits a low porosity.

21. The laminate of claim 1 wherein said copper has a porosity of less than about 3 pores/sq.ft.

22. The laminate of claim 5 wherein said copper has a porosity of less than about 3 pores/sq.ft.

23. The laminate of claim 6 wherein said copper has a porosity of less than about 3 pores/sq.ft.

24. The printed circuit board of claim 13, wherein said layer of copper is chemically etched to form said patterned circuit.